(12) United States Patent
Derner

(10) Patent No.: US 6,307,800 B1
(45) Date of Patent: Oct. 23, 2001

(54) CIRCUITS AND METHOD FOR MULTI-LEVEL DATA THROUGH A SINGLE INPUT/OUTPUT PIN

(75) Inventor: Scott J. Derner, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/256,871

(22) Filed: Feb. 24, 1999

Related U.S. Application Data

(63) Continuation of application No. 09/027,978, filed on Feb. 23, 1998, now Pat. No. 5,896,337.

(51) Int. Cl.$^7$ .................................................. G11C 7/00
(52) U.S. Cl. .................. 365/220; 365/168; 365/189.03; 365/189.07; 365/189.09; 365/189.11; 365/189.08
(58) Field of Search ..................... 365/189.03, 189.07, 365/189.09, 189.11, 168, 220, 189.08

(56) References Cited

U.S. PATENT DOCUMENTS

| 5,302,870 | 4/1994 | Chern ........................................ 327/51 |
| 5,367,655 | 11/1994 | Grossman et al. .............. 365/250.03 |
| 5,371,869 | 12/1994 | Lee ........................................ 713/600 |
| 5,394,362 | 2/1995 | Banks .............................. 365/185.03 |
| 5,457,650 | 10/1995 | Sigiura et al. ......................... 365/184 |
| 5,500,825 | 3/1996 | Onaya et al. .......................... 365/219 |
| 5,675,336 | 10/1997 | Hakkarainen ........................ 341/135 |
| 5,896,337 | * 4/1999 | Derner ................................. 365/220 |

FOREIGN PATENT DOCUMENTS

| 4135220C1 | 4/1993 | (DE) | ................................. G06F/3/06 |
| 2253078A | 8/1992 | (GB) | ................................. G06F/3/16 |

* cited by examiner

*Primary Examiner*—Andrew Q. Tran
(74) *Attorney, Agent, or Firm*—Schwegman, Lundberg, Woessner & Kluth, P.A.

(57) ABSTRACT

A method and memory circuits for increasing the data bandwidth per microprocessor operation cycle is provided. The memory circuits provide the additional bandwidth without additional input/output (I/O) pins or requiring decreased cycle times. Multiple bits of data are passed through a single input/output pin with each operation cycle. The multiple bits of data are stored in or retrieved from multiple memory cells in each cycle. The I/O pins carry analog signals which represent multiple values of binary data. This method of compressing data can be applied to any device that would benefit from the ability to transfer more data through a limited number of I/O pins.

38 Claims, 6 Drawing Sheets

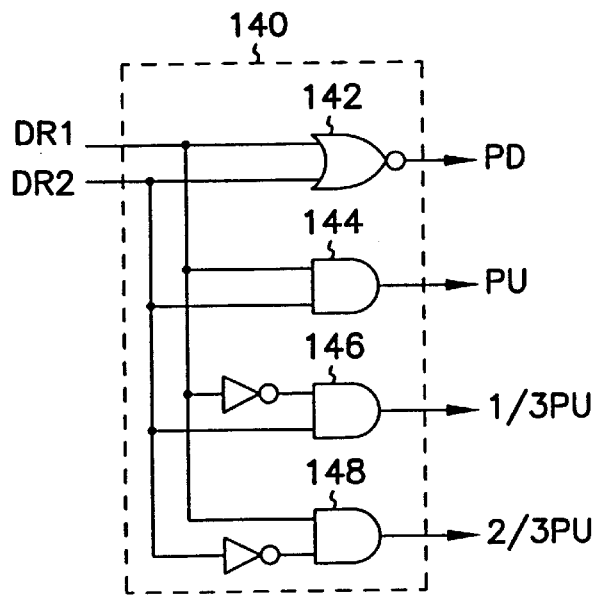
FIG. 4A
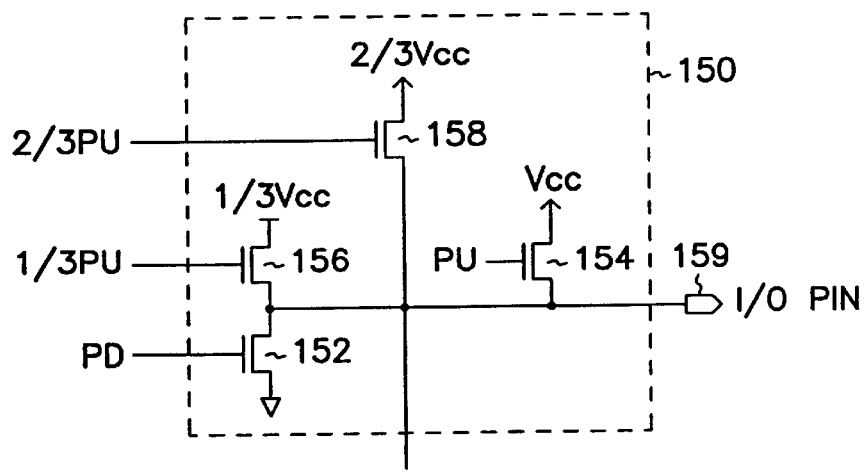
FIG. 4B
| DR1 | DR2 | PD | 1/3PU | 2/3PU | PU |
|-----|-----|----|----|----|----|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |
FIG. 4C

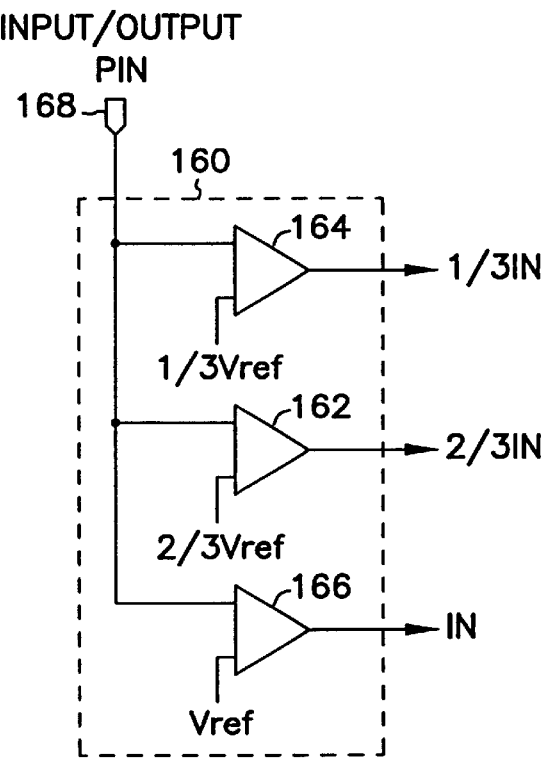
FIG. 5A
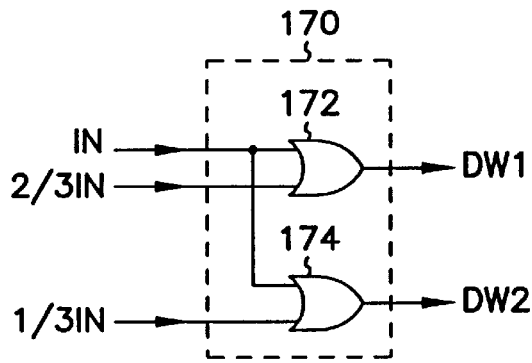
FIG. 5B
| IN | 2/3IN | 1/3IN | DW1 | DW2 |
|----|-------|-------|-----|-----|
| 0 | 0 | 0 | 0 | 0 |
| 0 | 0 | 1 | 0 | 1 |
| 0 | 1 | 0 | 1 | 0 |
| 1 | 0 | 0 | 1 | 1 |
FIG. 5C

CIRCUITS AND METHOD FOR MULTI-LEVEL DATA THROUGH A SINGLE INPUT/OUTPUT PIN

This application is a continuation of U.S. Ser. No. 09/027,978, filed Feb. 23, 1998, now U.S. Pat. No. 5,896,337.

FIELD OF THE INVENTION

The present invention relates generally to semiconductor integrated circuits. More particularly, it pertains to the retrieval and storage of multi-level data through a single input/output pin.

BACKGROUND OF THE INVENTION

Modern electronic systems typically include a data storage device such as a dynamic random access memory (DRAM), static random access memory (SRAM) or other conventional memory device. The memory device stores data in vast arrays of memory cells. Each cell conventionally stores a single bit of data (a logical "1" or a logical "0") and can be individually accessed or addressed. Data is output from a memory cell during a "read" operation, and data is stored into a memory cell during a "write" operation.

In a standard read or write operation, a column decoder and a row decoder translate address signals into a single intersection of a row (wordline) and column (bitline) within the memory array. This function permits the memory cell at that location to be read from or for data to be placed into that cell. The processing of data is dependent on the time it takes to store or retrieve individual bits of data in the memory cells. Storing and retrieving the bits of data is controlled generally by a microprocessor, whereby data is passed to and from the memory array through a fixed number of input/output (I/O) lines and I/O pins. According to current digital circuit technology, each I/O pin can access, at most, one bit of data during an operation cycle. This substantially limits the potential bandwidth or speed of the memory device.

Modern applications call on electronic systems to process data at greater speeds. In order for the systems to accord these demands, the system components must increase their processing speeds. One method to increase the processing speeds is to provide additional I/O pins on the system components. However, space limitations on both microprocessor chips and memory chips preclude simply adding more and more I/O pins. Another method to increase processing speeds is to decrease the cycle time for retrieving and storing data. Upper limits for increasing cycle speeds are set by current feature size (F) of the discrete devices from which the integrated circuit is composed. Modern photolithographic techniques, however, limit the size of the circuits that can be formed from semiconductor and other materials. At some point, the lithography cannot create a fine enough image with sufficient clarity to decrease the size of the elements of the circuit any further.

For the reasons stated above, and for other reasons stated below which will become apparent to those skilled in the art upon reading and understanding the present specification, it is desirable to develop other methods to increase the data throughput or data bandwidth without requiring an increase in I/O pins or further decrease the cycle times.

SUMMARY OF THE INVENTION

The above mentioned problems with memory devices and other problems are addressed by the present invention and will be understood by reading and studying the following specification. A memory circuit and method of increasing the data bandwidth per cycle are described which do not require additional input/output pins or a decrease in access times.

In particular, an illustrative embodiment of the present invention includes a memory array. The memory array has multiple rows of wordlines and multiple columns of bitlines. The intersection of the multiple rows of wordlines and multiple columns of bitlines form multiple memory cells. There are a number of sense amplifiers coupled to the multiple columns of bitlines. A number of column decoders are coupled to the number of sense amps. Each column decoder can access a select number of bitlines simultaneously. There are a number of row decoders coupled to the multiple rows of wordlines. A number of input/output lines are coupled to the bitlines through the number of sense amplifiers. Also, a number of logic circuits are included which couple to a subset of the input/output lines. The logic circuits use multiple voltage levels or references to control the reading and writing to more than one memory cell simultaneously. The reading and writing operations pass multiple bits through a single input/output pin with each operation cycle.

In another embodiment, a memory circuit is provided which similarly has a memory array. The memory array has multiple rows of wordlines and multiple columns of bitlines. At the intersections of the multiple rows of wordlines and multiple columns of bitlines are located multiple memory cells. A number of sense amplifiers are coupled to the multiple columns of bitlines. A number of column decoders couple to the number of sense amps such that a column decoder selects the output of at least two (2) sense amps. A number of row decoders couple to the multiple rows of wordlines. There are a number of input/output lines coupled to the bitlines through the number of sense amplifiers. There are a number of logic circuits which have multiple inputs and outputs. Each of the logic circuits is coupled to a subset of the input/output lines. The outputs of at least one of the number of logic circuits individually couples to a number of pull-up or pull-down transistors. The inputs of at least one of the number of logic circuits individually couples to a number of comparators. Each of the number of logic circuits uses multiple voltage levels to write to or read from more than one memory cell at a time.

In another embodiment, a method for writing to multiple memory cells using a single input pin is provided. The method includes receiving a voltage at the pin that represents values to be stored in several memory cells. The voltage at the pin is compared with a number of distinct voltage references using a number of comparators. The output of the comparing step is coupled to a logic circuit. The method includes the logic circuit outputting bits of data to a select number of input/output lines. A row in an array of memory cells is activated. The array has multiple rows of wordlines and multiple columns of bitlines. A select number of columns in the array of memory cells are activated simultaneously by a column decoder. The method further includes placing the bits of data located on the select number of input/output lines into memory cells located at the intersection of the activated row and select number of activated columns. The select number of input/output lines equals the select number of columns accessed simultaneously by one column decoder.

In another embodiment, a method for reading multiple memory cells using a single output pin is provided. The method includes activating a row in an array of memory cells. The array has multiple rows of wordlines and multiple columns of bitlines. The method also includes activating a select number of columns in the array of memory cells. The select number of columns are simultaneously accessed by a single column decoder. Bits of data located at the intersection of the activated row and select number of columns are placed onto a select number of input/output lines. The select number of input/output lines are then coupled to a logic circuit. The logic circuit has a number of outputs and each output is individually coupled to a pull-up or a pull-down transistor. The method further includes coupling the pull-up and pull-down transistors to a single output pin.

In another embodiment, an information handling system is provided. The information handling system includes a central processing unit and a random access memory (RAM). The RAM has a number of input/output pins. The RAM has multiple rows of wordlines and multiple columns of bitlines. The RAM has a number of sense amplifiers coupled to the multiple columns of bitlines. The RAM has a column decoder coupled to the multiple columns of bitlines that accesses a select number of bitlines simultaneously. The RAM has a row decoder coupled to the multiple rows of wordlines. There are a number of input/output lines coupled to the number of bitlines through sense amplifiers. A number of first logic circuits are each coupled to a select number of input/output lines. There are a number of pull-up transistors and a pull-down transistor coupled between an input/output pin and the first logic circuit for reading data out of the random access memory. A number of comparators are coupled to each input/output pin and each comparator is connected to a distinct voltage reference. A second logic circuit is coupled to the number of comparators for an input/output pin. The second logic circuit couples to a select number of input/output lines at any one time for writing data into the random access memory. A system bus communicatively couples to the central processing unit and the RAM.

This invention enables an electronic system with a memory circuit to have a greater data bandwidth or speed without increasing the number of input/output pins or decreasing the access time of the part. It is advantageous over increasing the input/output pin count because it uses much less die area for the bond pad area and possibly less area for signal routing. The implementation of the present invention will enable memory circuits to operate faster without having to resize the transistors, change the memory addressing sequence, change the operating voltage, or using other methods for increasing the overall speed of microprocessors. This method of compressing data can be applied to any device that would benefit from the ability to transfer more data through a limited number of I/O pins.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 4A is a boolean logic circuit illustrating in more detail an embodiment of the I/O read logic portion of the I/O control circuit of FIG. 3.

FIG. 4B is a schematic diagram illustrating in more detail an embodiment of the pull-up/pull-down portion of the I/O control circuit of FIG. 3.

FIG. 4C is a truth table illustrating the inputs and outputs according to the embodiment of the logic circuit in FIG. 4A.

FIG. 5A is a schematic diagram illustrating in more detail an embodiment of the comparator circuit portion of the I/O control circuit of FIG. 3.

FIG. 5B is a boolean logic circuit illustrating in more detail an embodiment of the I/O write logic circuit portion of the I/O control circuit of FIG. 3.

FIG. 5C is a truth table illustrating the inputs and outputs according to the embodiment of the logic circuit in FIG. 5B.

DESCRIPTION OF THE EMBODIMENTS

Figure 1:
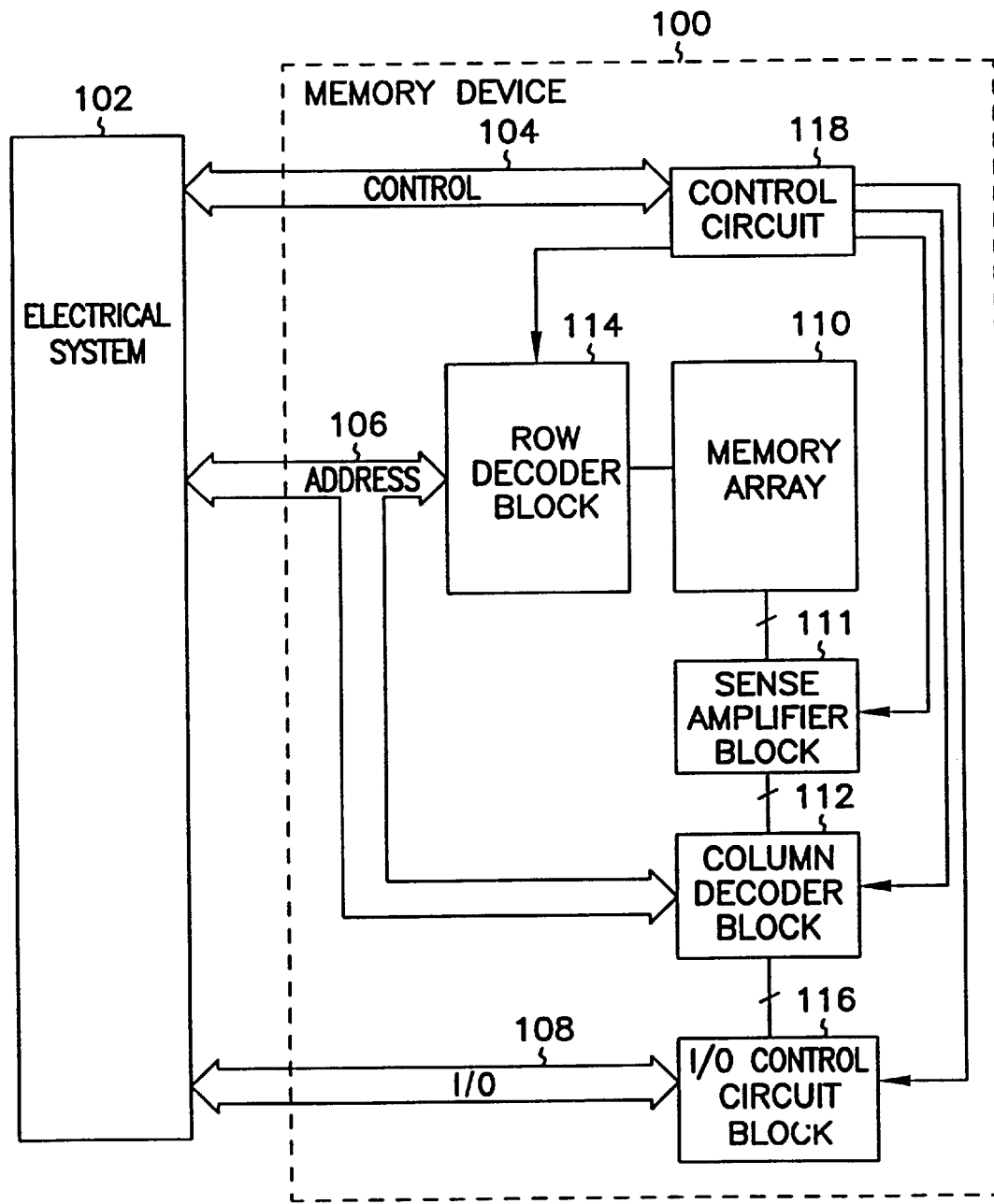
FIG. 1 is a block diagram illustrating an memory circuit according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1 is a block diagram illustrating an electronic circuit according to the teachings of the present invention.

FIG. 1 includes a memory array 110. The memory array 110 is coupled to a sense amplifier block 111. The sense amplifier block is coupled to a column decoder block 112. The memory array 110 is coupled to a row decoder block 114. The column decoder block 112 is additionally coupled to an input/output (I/O) control circuit block 116.

FIG. 1 further includes an electronic system 102. The electronic system 102 couples through a control bus 104 to a control circuit 118. The control circuit 118 couples to the row decoder block 114, the sense amplifier block 111 the column decoder block 112 and the input/output control circuit block 116. The I/O control circuit block 116 additionally includes a grouping of a number of input/output pins 108 which couple to the electronic system 102. The electronic system 102 further includes an address bus 106 that couples to the row decoder block 114 and the column decoder block 112. The control circuit 118, the row decoder block 114, the memory array 110, the sense amplifier block 111, the column decoder block 112 and the I/O control circuit block 116 all form a part of memory device 100.

Figure 2:
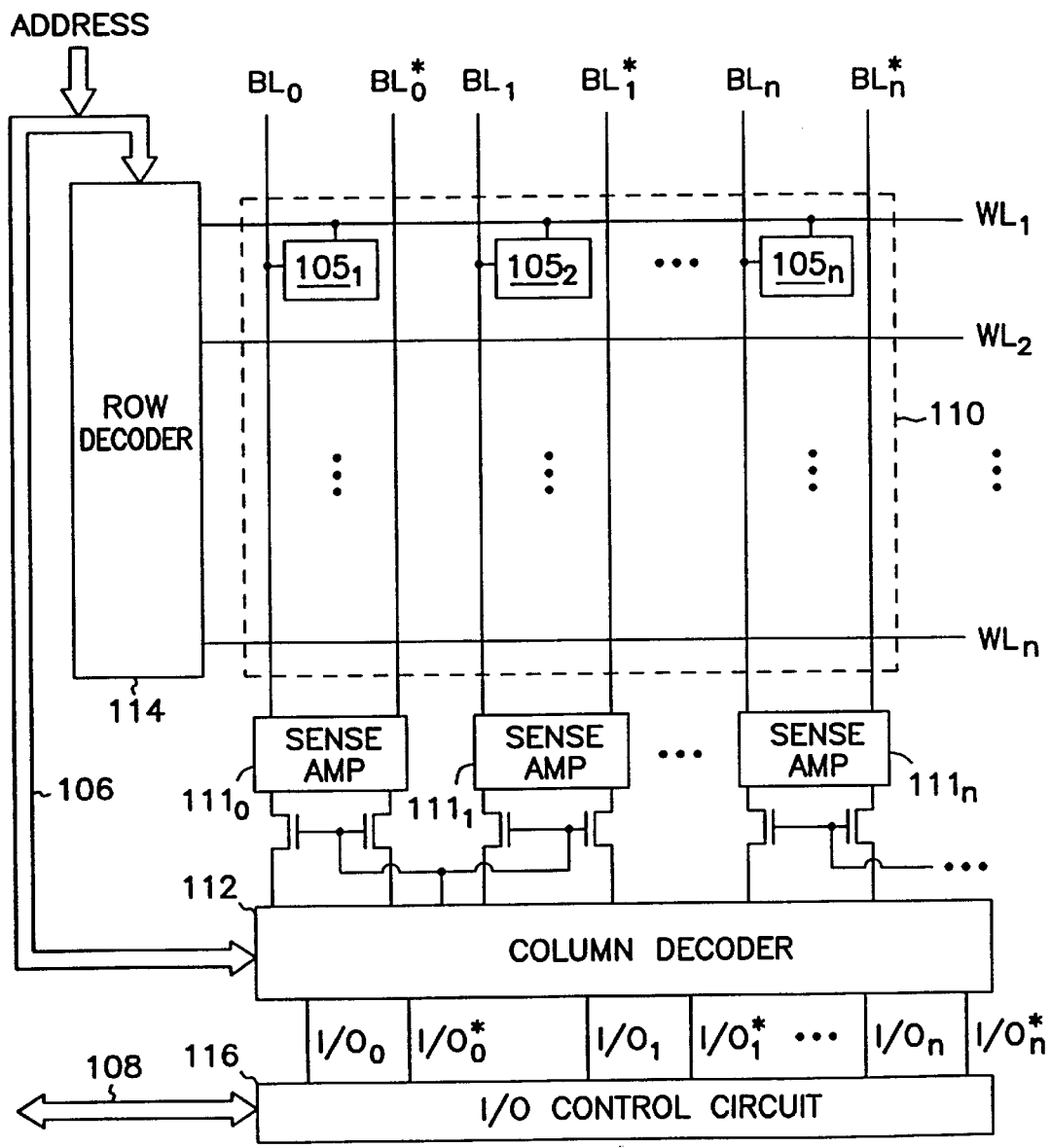
FIG. 2 is a block diagram illustrating in more detail the array of memory cells, the row and column decoders, and the input/output (I/O) control circuit of the memory circuit of FIG. 1.

FIG. 2 is a block diagram illustrating in more detail a portion of the memory device 100. Memory array 110 includes multiple rows of wordlines, $WL_1, WL_2, \ldots, WL_n$, and multiple columns of bitlines, $BL_0, BL_1, \ldots, BL_n$. The intersection of the multiple rows of wordlines, $WL_1, W_2, \ldots, WL_n$, and multiple columns of bitlines, $BL_0, BL_1, \ldots, BL_n$, form multiple memory cells $105_1$–$105_n$. The sense amplifier block 111 comprises a number of sense amplifiers, $111_0, 111_1, \ldots, 111_n$, which couple to the multiple columns of bitlines. The column decoder block 112 comprises a number of column decoders coupled to the number of sense amplifiers $111_0, 111_1, \ldots, 111_n$. Each column decoder accesses a select number of bitlines simultaneously. The row decoder block 114 includes a number of row decoders which couple to the multiple rows of wordlines. A number of input/output lines, $I/O_0, I/O_{1s}, \ldots, I/O_n$, couple to the number of bitlines through the number of sense amplifiers. An address bus 106 couples to both the row decoder block 114 and the column decoder block 112. The number of input/output lines couple to the I/O control circuit block 116 and a number of I/O pins 108 couple to the I/O control circuit block.

Figure 3:
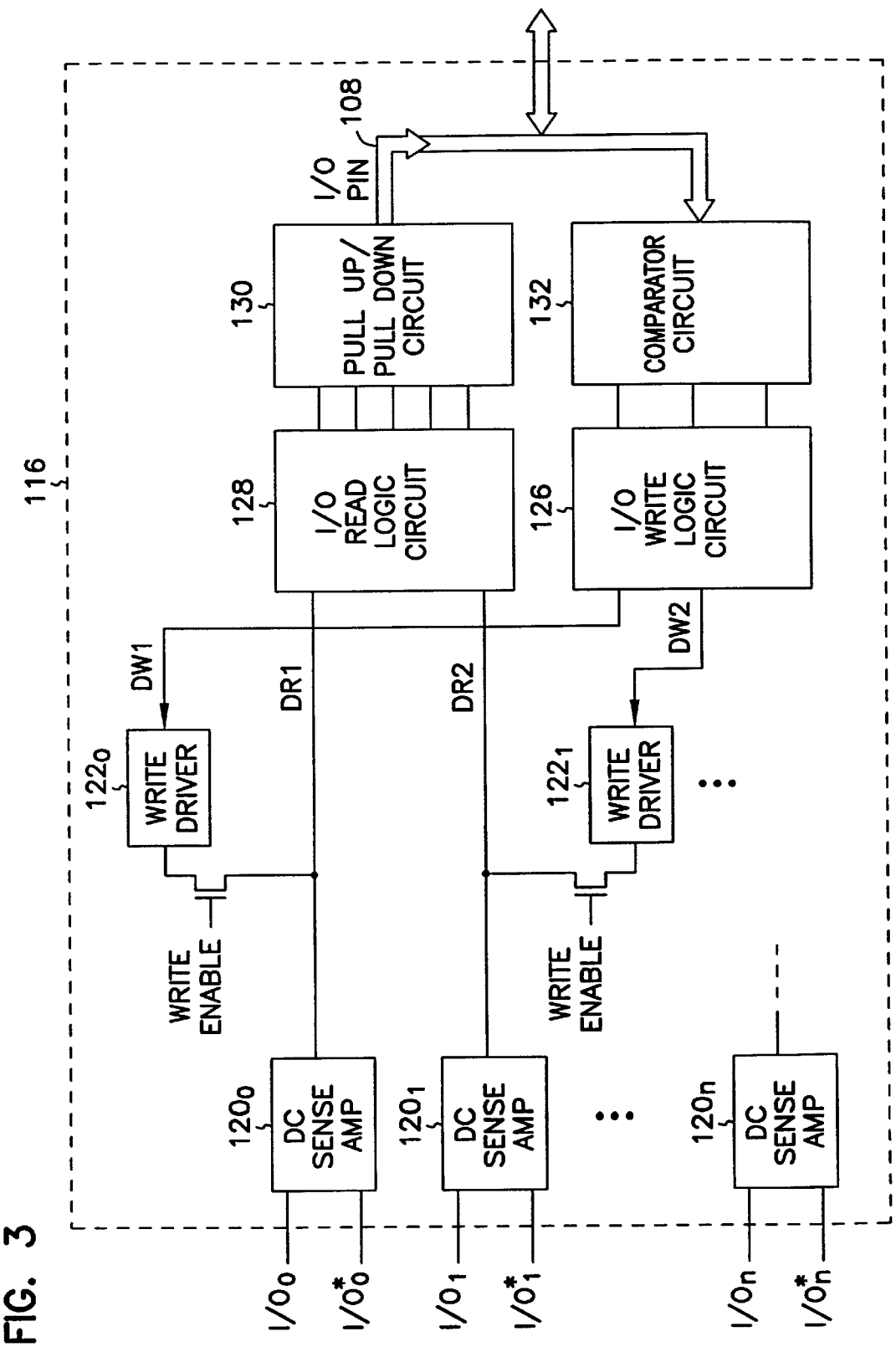
FIG. 3 is a block diagram illustrating in more detail the (I/O) control circuit portion of the memory circuit of FIG. 1.

FIG. 3 is a block diagram illustrating in more detail a portion of the I/O control circuit block 116 of the electronic circuit of FIG. 1. In FIG. 3, a number of input/output lines, $I/O_0, I/O_1, \ldots, I/O_n$, and their complementary pairs are coupled to a number of DC sense amplifiers, $120_0, 120_1, \ldots, 120_n$. The input/output lines, $I/O_0, I/O_1, \ldots, I/O_n$, couple from the DC sense amplifier to a write enable pass transistor and into an input/output (I/O) read logic circuit 128. When the write enable pass transistor is deactivated, the number of input/output lines couple only to the I/O read logic circuit 128. The I/O read logic circuit 128 has multiple inputs and outputs. The outputs of the I/O read logic circuit 128 couple to a pull-up/pull-down circuit 130. The pull-up/pull-down circuit 130 couples to and delivers an analog output to a single input/output (I/O) pin 108. In any given "read" operation cycle, at least two pairs of complementary input/output lines have deactivated write enable pass transistors and directly input simultaneously into the I/O read logic circuit 128. In this embodiment, a single I/O pin 108 reads from at least two memory cells simultaneously. In an alternative embodiment, a single I/O pin reads from at least four memory cells simultaneously.

Conversely, when the write enable pass transistors are activated, the input/output lines, $I/O_0, I/O_1, \ldots, I/O_n$, couple through a write driver shown in FIG. 3 as $122_0$ and $122,$. The write driver, $122_0$ and 122, respectively, receives the output of an I/O write logic circuit 126. The I/O write logic circuit 126 receives a number of inputs from a comparator circuit 132. The comparator circuit 132 receives an input from a single I/O pin 108. In any given "write" operation cycle, at least two write enable pass transistors are activated simultaneously such that the output of the I/O write logic circuit 126 is coupled to at least two sets of input/output lines. This allows for a single I/O pin 108 to write to at least two memory cells simultaneously. In an alternative embodiment, a single I/O pin writes to at least four memory cells simultaneously.

FIG. 4A provides a Boolean logic circuit 140 which exemplifies in more detail an embodiment of the I/O read logic circuit 128 of the I/O control circuit block 116 of FIG. 3. In this embodiment, two input/output (I/O) lines, DR1 and DR2 respectively, couple to the I/O read logic circuit 128. The Boolean logic circuit 140 includes a NOR gate 142 outputting to a pull-down gate. The Boolean logic circuit 140 further includes a series of AND gates 144, 146 and 148 respectively. The output of AND gate 144 couples to a pull-up transistor. The output of AND gate 146 couples to a second pull-up transistor, and the output of AND gate 148 couples to a third pull-up transistor.

FIG. 4B provides a pull-up/pull-down circuit 150 which exemplifies, in more detail, an embodiment of the pull-up/pull-down circuit 130 of the I/O control circuit block 116. The pull-up/pull-down circuit 150 includes a number of pull-up and pull-down transistors. In the embodiment, a pull-up transistor 154 is coupled to a voltage level of $V_{dd}$. A pull-up transistor 156 is coupled to a voltage level of one-third ($\frac{1}{3}$) $V_{dd}$. A pull-up transistor 158 is coupled to a voltage level of two-thirds ($\frac{2}{3}$) $V_{dd}$. Further, a pull-down transistor 152 is coupled to ground. The pull-up and pull-down transistors, 152, 154, 156, and 158 respectively, are collectively coupled to a single input/output (I/O) pin 159. In this embodiment, the number of pull-up and pull-down transistors output a single analog signal through a single I/O pin.

FIG. 4C is a truth table illustrating the inputs and outputs according to the embodiment of the Boolean logic circuit 140, illustrated in FIG. 4A. As illustrated, the four logical combinations for DR1 and DR2 each activate one of the transistors of pull-up/pull-down circuit 150. The selected transistor either pulls the I/O pin 159 up to its associated supply voltage, or down to ground. This analog voltage indicates the values stored in the multiple cells that are read simultaneously.

FIG. 5A provides a comparator circuit 160 which exemplifies, in more detail, an embodiment of the comparator circuit 132 of the I/O control circuit 116 of FIG. 3. In this embodiment, comparator circuit 160 receives an input through a single I/O pin 168. I/O pin 168 may be one in the same with I/O pin 159 above. The I/O pin 168 carries an analog signal. The I/O pin 168 couples to a number of comparators, 162, 164, 166 respectively. Each comparator, 162, 164, and 166 respectively, couples to a different voltage reference level. Comparator 166 couples to a voltage reference level of $V_{dd}$ Comparator 164 couples to a voltage level reference of two-thirds ($\frac{2}{3}$) $V_{dd}$. Comparator 162 couples to a voltage level reference of one-third ($\frac{1}{3}$) $V_{dd}$.

FIG. 5B provides a Boolean logic circuit 170 illustrating in more detail an embodiment of the I/O write logic circuit 126 of the I/O control circuit 116 of FIG. 3. In this embodiment, Boolean logic circuit 170 includes a pair of OR gates, 172 and 174 respectively. The Boolean logic circuit 170 receives multiple inputs from the embodiment of the comparator circuit 160. The Boolean logic circuit 170 outputs to I/O lines DW1 and DW2. The I/O lines, DW1 and DW2, carry digital signals. The output of the $V_{dd}$ comparator and the two-thirds ($\frac{2}{3}$) $V_{dd}$ comparator are input to OR gate 172 of the Boolean logic circuit 170. The output of the $V_{dd}$ comparator and the one-third ($\frac{1}{3}$) $V_{dd}$ comparator are input into OR gate 174.

FIG. 5C is a truth table illustrating the inputs and outputs according to the embodiment of Boolean logic circuit 170 illustrated in FIG. 5B. As illustrated, the four logical combinations for DW1 and DW2 each result from the output of a pair of comparators of comparator circuit 160. The output of the comparators route the analog signal received from the I/O pin 168 to the Boolean logic circuit 170. The Boolean logic circuit 170 translates the values represented by the analog signal into bits of digital data for storage in multiple cells simultaneously.

Method of Operation

In operation, the method of writing to multiple memory cells, within memory array 110, includes receiving an analog voltage at a single input/output (I/O) pin 108. The voltage received at the pin 108 represents at least two (2) binary values to be stored in multiple memory cells. The voltage received at the I/O pin 108 is input to a comparator circuit 132. The comparator circuit 132 includes an exemplary embodiment, such as comparator circuit 160. The comparator circuit 160 includes a number of comparators, 162, 164, and 166 respectively. The voltage input, received at I/O pin 108, is compared with a number of distinct voltage references using comparators, 162, 164, and 166 respectively. The distinct voltage references include $V_{dd}$, two-thirds ($\frac{2}{3}$) $V_{dd}$, and one-third ($\frac{1}{3}$) $V_{dd}$. The output of comparator circuit 160 is coupled to an I/O write logic circuit 126. The I/O write logic circuit 126 includes an embodiment of Boolean logic circuit 170. Boolean logic circuit 170 outputs to a select number of input/output lines. The select number of I/O lines, equals at least two, DW1 and DW2 respectively. A row (wordline) within the memory array 110 is activated. A select number of columns within the memory array 110 are activated by the column decoder 112, e.g., two columns. The bits of data located on the select number of input/output lines, DW1 and DW2 respectively, are placed into individual memory cells, within the array 110, which are located at the intersection of the activated row and select number of activated columns. In one embodiment, the select number of input/output lines, DW1 and DW2 respectively, equals the select number of columns accessed simultaneously by the column decoder 112.

In the read operation, the method includes activating a row (wordline) in a memory array 110. Column decoder 112 activates a select number of columns of bitlines in the memory array 110. Bits of digital data, located at the intersection of the activated row and select number of columns, are placed onto a select number of input/output lines. In one embodiment, the bits of data are placed on at least two (2) I/O lines, DR1 and DR2 respectively. The select number of I/O lines are coupled to an I/O read logic circuit 128 wherein the I/O read logic circuit 128 has a number of outputs. The number of I/O lines coupling to an embodiment of the I/O read logic circuit 128 carry bits of digital data into the I/O read logic circuit 128. Each output of the I/O read logic circuit 128 is coupled to a pull-up/pull-down circuit 130. The I/O read logic circuit 128 includes the embodiment of Boolean logic circuit 140. The Boolean logic circuit 140 includes NOR gate 142, AND gate 144, AND gate 146, and AND gate 148. Each of the gates, 142, 144, 146, and 148 respectively, have outputs such that each output is individually coupled to a pull-up or pull-down transistor within pull-up/pull-down circuit 130. The pull-up/pull-down circuit 130 includes a pull-down transistor 152, a pull-up transistor 154, a pull-up transistor 156, and a pull-up transistor 158. The number of pull-up and pull-down transistors in pull-up/pull-down circuit 130 couple to multiple voltage levels. The number of pull-up and pull-down transistors in pull-up/pull-down circuit 130 couple an analog signal to a single input/output pin 159.

Figure 6:
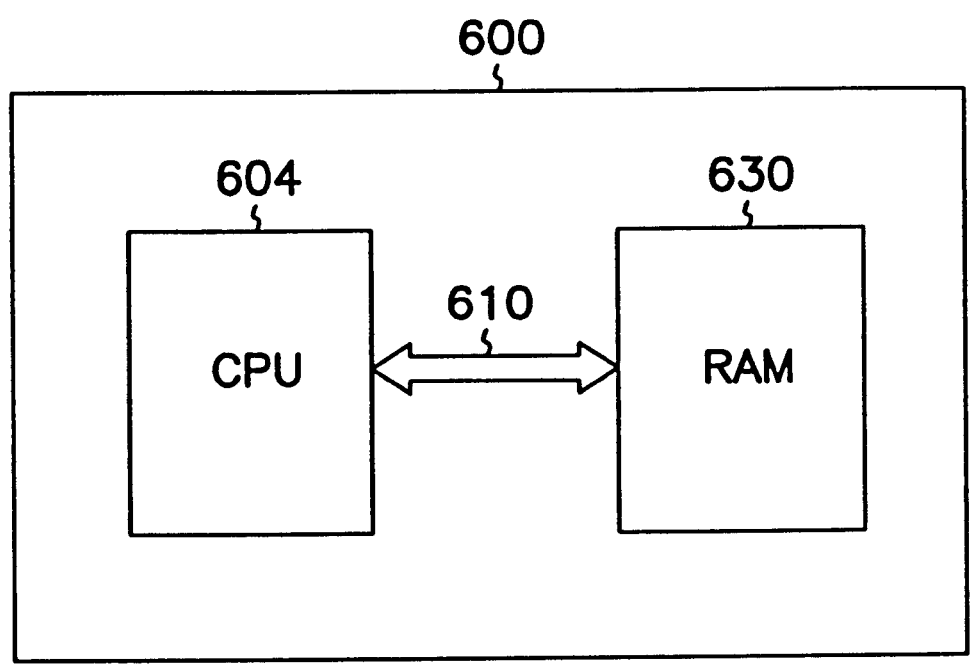
FIG. 6 is a block diagram illustrating an information handling system according to an embodiment of the present invention.

FIG. 6 is a block diagram illustrating an information handling system 600 according to an embodiment of the present invention. The information handling system includes a central processing unit 604. The central processing unit is coupled to a random access memory (RAM) 630 by a system bus 610. The RAM can be constructed as the memory device 100 shown in the previous Figures.

Conclusion

It is to be understood that the above description is intended to be illustrative, and not restrictive. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. The scope of the invention should be determined with reference to the appended claims along with the full scope of equivalents to which such claims are entitled.

What is claimed is:

1. An electronic system having a number of input/output pins, the electronic system comprising:
    a number of logic circuits, wherein the number of input/output pins couple to the number of logic circuits;
    a number of input/output lines coupled to the number of logic circuits; and
    wherein the number of logic circuits use multiple voltage levels to control inputting bits of data to more than one input/output line or to control outputting bits of data from more than one input/output line using a single input/output pin.

2. The electronic system of claim 1, wherein the single input/output pin inputs bits of data to at least four (4) input/output lines simultaneously.

3. The electronic system of claim 1, wherein the single input/output pin outputs bits of data from at least four (4) input/output lines simultaneously.

4. The electronic system of claim 1, wherein the number of logic circuits use voltage levels of zero (0), one-third ($\frac{1}{3}$), two-thirds ($\frac{2}{3}$) and one (1) $V_{dd}$ to distinguish binary states for two input/output lines using the single input/output pin.

5. The electronic system of claim 1, wherein the number of logic circuits comprise multiple inputs and outputs, and wherein the outputs of at least one of the number of logic circuits each individually couple to a pull-up or pull-down transistor for outputting data from the number of input/output lines.

6. The electronic system of claim 1, wherein the number of logic circuits comprise multiple inputs and outputs, and wherein the input of at least one of the number of logic circuits couples to a number of comparators for inputting bits of data to the number of input/output lines.

7. The electronic system of claim 1, wherein the number of logic circuits comprise a number of outputs, the number of outputs coupled to a number of pull-up devices, and the pull-up devices are coupled to different voltage levels.

8. The electronic system of claim 7, wherein the number of pull-up devices are coupled to individual voltage references of one-third ($\frac{1}{3}$), two-thirds ($\frac{2}{3}$) and one (1) $V_{dd}$.

9. The electronic system of claim 1, wherein the number of logic circuits comprise a number of inputs, the number of inputs coupled to a number of comparators, and the comparators are coupled to different voltage references.

10. The electronic system of claim 9, wherein the number of comparators are coupled to individual voltage references of one-third ($\frac{1}{3}$), two-thirds ($\frac{2}{3}$) and one (1) $V_{dd}$.

11. A semiconductor circuit, comprising:

a number of input/output pins;

a number of logic circuits, wherein the number of input/output pins couple to the number of logic circuits;

a number of input/output lines coupled to the number of logic circuits; and wherein the number of logic circuits have multiple inputs and outputs each coupled to a subset of the input/output lines, wherein the outputs of at least one of the number of logic circuits individually couple to a number of pull-up or pull-down transistors, wherein the input of at least one of the number of logic circuits couples to a number of comparators, and wherein the number of logic circuits use multiple voltage levels to input bits of data to or output bits of data from more than one input/output line.

12. The semiconductor circuit of claim 11, wherein the multiple voltage levels are zero (0), one-third (⅓), two-thirds (⅔) and one (1) $V_{dd}$.

13. The semiconductor circuit of claim 11, wherein the input to the number of comparators couples to a single input/output pin.

14. The semiconductor circuit of claim 11, wherein the number of pull-up and pull-down transistors output an analog signal to a single input/output pin.

15. The semiconductor circuit of claim 11, wherein the number of input/output lines carry digital signals.

16. An integrated circuit comprising:

a number of input/output pins;

a number of input/output lines;

a number of first logic circuits, each first logic circuit coupled to the number of input/output lines;

for each first logic circuit, a number of pull-up transistors and a pull-down transistor coupled between one of the number of input/output pins and the first logic circuit for outputting bits of data from the number of input/output lines onto the one input/output pin;

a number of comparators coupled to each input/output pin, wherein each comparator is connected to a distinct voltage reference; and a second logic circuit coupled to the number of comparators for an input/output pin; and wherein the second logic circuit couples to the number of input/output lines for inputting bits of data from the input/output pin to the number of input/output lines.

17. The integrated circuit of claim 16, wherein the input/output pin carries an analog signal.

18. The integrated circuit of claim 16, wherein the input/output lines carry digital signals.

19. An electronic system having a number of input/output pins, the electronic system comprising:

a number of logic circuits, wherein the number of input/output pins couple to the number of logic circuits;

a number of input/output lines coupled to the number of logic circuits wherein the number of logic circuits includes:

a read logic circuit coupled to at least two input/output lines; and a pull-up/pull-down circuit coupled between the read logic circuit and a single input/output pin; and wherein the number of logic circuits use multiple voltage levels to control inputting bits of data to the at least two input/output lines or to control outputting bits of data from the at least two input/output lines using said single input/output pin.

20. The electronic system of claim 19, wherein the single input/output pin inputs bits of data to at least four (4) input/output lines simultaneously.

21. The electronic system of claim 19, wherein the single input/output pin outputs bits of data from at least four (4) input/output lines simultaneously.

22. The electronic system of claim 19, wherein the number of logic circuits use voltage levels of zero (0), one-third (⅓), two-thirds (⅔) and one (1) $V_{dd}$ to distinguish binary states for the at least two input/output lines using said single input/output pin.

23. The electronic system of claim 19, wherein the number of logic circuits comprise multiple inputs and outputs, and wherein the outputs of the read logic circuit each individually couple to a pull-up or a pull-down transistor in the pull-up/pull-down circuit for outputting data from the at least two input/output lines.

24. The electronic system of claim 19, wherein the number of logic circuits further includes:

a comparator circuit coupled to one of the number of input/output pins; and a write logic circuit coupled between the comparator circuit and the at least two input/output lines.

25. The electronic system of claim 24, wherein the one of the number of input/output pins couples to a number of comparators in the comparator circuit for inputting multiple bits of data to the at least two input/output lines.

26. The electronic system of claim 24, wherein the read logic circuit includes a number of outputs, the number of outputs coupled to a number of pull-up devices, and wherein the pull-up devices are coupled to different voltage levels.

27. The electronic system of claim 26, wherein the number of pull-up devices are coupled to individual voltage references of one-third (⅓), two-thirds (⅔) and one (1) $V_{dd}$.

28. An electronic system having a number of input/output pins, the electronic system comprising:

a number of logic circuits, wherein the number of input/output pins couple to the number of logic circuits;

a number of input/output lines coupled to the number of logic circuits wherein the number of logic circuits includes:

a comparator circuit coupled to one of the number of input/output pins; and a write logic circuit coupled between the comparator circuit and at least two input/output lines; and wherein the number of logic circuits use multiple voltage levels to control inputting bits of data to the at least two input/output lines or to control outputting bits of data from the at least two input/output lines using a single input/output pin.

29. The electronic system of claim 28, wherein the one of the number of input/output pins coupled to the comparator circuit couples to a number of comparators, and wherein the comparators are coupled to different voltage references.

30. The electronic system of claim 29, wherein the number of comparators are coupled to individual voltage references of one-third (⅓), two-thirds (⅔) and one (1) $V_{dd}$.

31. An electronic system having a number of input/output pins, the electronic system comprising:

a number of logic circuits, wherein the number of input/output pins couple to the number of logic circuits;

a number of input/output lines coupled to the number of logic circuits wherein the number of logic circuits includes:

a read logic circuit coupled to at least two input/output lines;

a pull-up/pull-down circuit coupled between the read logic circuit and a single input/output pin;

a comparator circuit coupled to the single input/output pin; and a write logic circuit coupled between the comparator circuit and the at least two input/output lines; and wherein the number of logic circuits use multiple voltage levels to control inputting bits of data to the at least two input/output lines or to control outputting bits of data from the at least two input/output lines using said single input/output pin.

32. The electronic system of claim 31, wherein the single input/output pin inputs bits of data to at least four (4) input/output lines simultaneously.

33. The electronic system of claim 31, wherein the single input/output pin outputs bits of data from at least four (4) input/output lines simultaneously.

34. The electronic system of claim 31, wherein the number of logic circuits use voltage levels of zero (0), one-third (1/3), two-thirds (2/3) and one (1) $V_{dd}$ to distinguish binary states for the at least two input/output lines using said single input/output pin.

35. The electronic system of claim 31, wherein the number of logic circuits comprise multiple inputs and outputs, and wherein the outputs of the read logic circuit each individually couple to a pull-up or a pull-down transistor in the pull-up/pull-down circuit for outputting data from the at least two input/output lines.

36. The electronic system of claim 31, wherein the single input/output pin couples to a number of comparators in the comparator circuit for inputting multiple bits of data to the at least two input/output lines.

37. The electronic system of claim 31, wherein the read logic circuit includes a number of outputs, the number of outputs coupled to a number of pull-up devices in the pull-up/pull-down circuit, and wherein the pull-up devices are coupled to different voltage levels.

38. The electronic system of claim 37, wherein the number of pull-up devices are coupled to individual voltage references of one-third (1/3), two-thirds (2/3) and one (1) $V_{dd}$.

* * * * *

UNITED STATES PATENT AND TRADEMARK OFFICE
CERTIFICATE OF CORRECTION

PATENT NO. : 6,307,800 B1
DATED : October 23, 2001
INVENTOR(S) : Scott J. Derner It is certified that error appears in the above-identified patent and that said Letters Patent is hereby corrected as shown below:

Column 3,
Line 46, delete "using" and insert -- use --, therefor.

Column 5,
Line 16, delete "$W_Z$" and insert -- $WL_Z$ --, therefor.
Line 20, delete "112" after "block" and insert -- 114 --, therefor.
Line 26, delete "$I/O_{1S}$" and insert -- $I/O_1$ --, therefor.
Lines 57 and 58, delete "1220 and 122," and insert -- 121$_0$ and 122$_1$ --, therefor.

Signed and Sealed this

Fourth Day of June, 2002

*Attest:*

JAMES E. ROGAN
*Director of the United States Patent and Trademark Office*

*Attesting Officer*